United States Patent [19] | [11] 4,131,331
Kendall, Jr. | [45] Dec. 26, 1978

[54] WATERPROOF ELECTRICAL CONNECTOR

[75] Inventor: Giles A. Kendall, Jr., Glendora, Calif.
[73] Assignee: Clemar Mfg. Corp., Azusa, Calif.

[21] Appl. No.: 852,852
[22] Filed: Nov. 18, 1977
[51] Int. Cl.[2] .......... H01R 3/02; H05K 5/06
[52] U.S. Cl. .......... 339/126 RS; 174/52 PE; 339/116 R
[58] Field of Search .......... 339/116 R, 126 R, 126 RS, 339/143 R, 275 R, 94 A; 179/50.52, 50.53, 50.59, 50.61, 50.56, 31 R, 31.5, 151, 152 R, 167, 52 PE

[56] References Cited

U.S. PATENT DOCUMENTS 2,806,080 9/1957 Corey .......... 174/151 X
3,398,391 8/1968 Brishka .......... 339/94 A
3,605,076 9/1971 Dozier .......... 339/126 RS
3,770,878 11/1973 Dozier .......... 339/126 R X

*Primary Examiner*—Roy Lake
*Assistant Examiner*—E. F. Desmond
*Attorney, Agent, or Firm*—Fulwider, Patton, Rieber, Lee & Utecht

[57] ABSTRACT

A waterproof feed-through electrical connector having a conductive insert which is fitted through a wall of thermoplastic material in such a manner as to induce cold flow of the thermoplastic material, and thereby provide a watertight seal between the conductive insert and the wall. A cup of potting material encloses the conductor on one side of the wall, to form a secondary seal.

6 Claims, 2 Drawing Figures

WATERPROOF ELECTRICAL CONNECTOR

BACKGROUND OF THE INVENTION

The present invention relates to electrical connectors, and, more particularly, to connectors employed for making electrical connection to devices enclosed in watertight packages or enclosures.

Electrical connections often must be made through watertight enclosures. For example, modern irrigation control systems often employ an electronic decoder located at or close to an electrically operated water valve. The decoder is usually positioned in a valve box which is subject to flooding, so that the decoder must be housed in a completely watertight package and electrical connections have to be made through the package walls. Fused glass hermetic bulkhead connectors are available for this purpose, but they are relatively expensive for such applications as irrigation control systems.

Previous attempts to provide a low-cost feed-through wire connection to a watertight electrical package have typically utilized a potting cup through which an insulated wire conductor is passed, and which is later filled with a theoretically waterproof potting material. In practice, however, water can "wick" along the wires by capillary action, if there is a small nick or crack in the wire insulation. Moreover, many potting compounds will provide a leakage path around the interface between the wire insulation and the potting compound, or may even have an open-cell structure which itself provides a leakage path. Accordingly, it will be appreciated that there is still a real need for an effective low-cost, feed-through electrical connector which is completely watertight. The present invention fulfills this need.

SUMMARY OF THE INVENTION

The present invention resides in a waterproof connector, and a related method for its manufacture, the connector comprising a portion of a plastic watertight wall, preferably of thermoplastic material, having an appropriate hole therethrough, and a conductive insert sized to be fitted in the hole in such a manner as to cause cold flow of the plastic material into surface imperfections of the insert, thereby forming a watertight seal. As a secondary seal, the connector of the invention includes a potting cup formed inwardly with respect to the wall, and a potting agent filling the potting cup to provide an additional watertight seal in the event that the interface between the insert and the plastic material should be damaged on assembly.

It will be apparent from the foregoing summary that the present invention represents a significant advance in the field of waterproof electrical connectors. In particular, it provides a low-cost waterproof connector having substantially improved performance over previously available low-cost connectors. Other aspects and advantages of the present invention will become apparent from the following more detailed description, taken in conjunction with the accompanying drawings.

DETAILED DESCRIPTION

Figure 1:
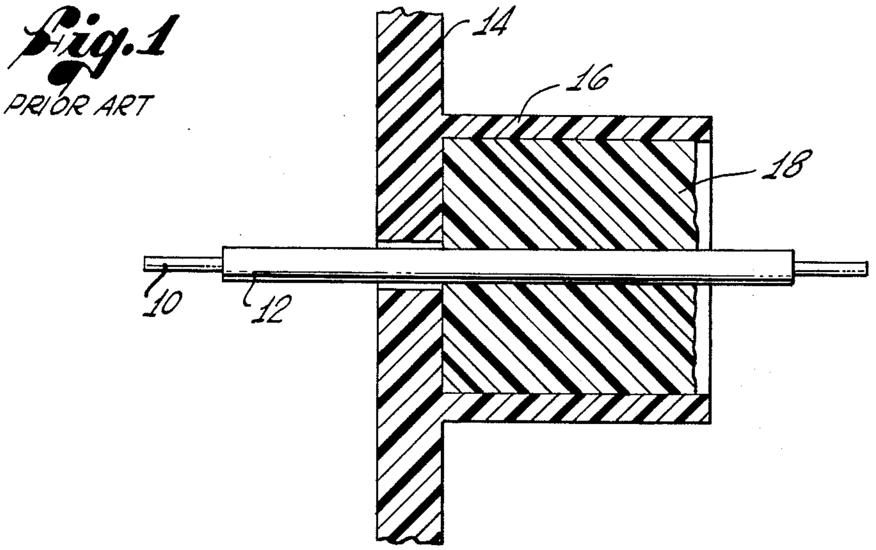
Fig.1 PRIOR ART
FIG. 1 is an elevational view, partly in section, of a typical electrical connector of the prior art.

As shown in the drawings for purposes of illustration, the present invention is embodied in a waterproof electrical connector. FIG. 1 shows a typical connector assembly of the prior art. An electrical conductor, indicated by reference numeral 10, is sheathed for part of its length in an insulating material 12, and extends through an exterior wall 14 of an enclosure or package (not shown in full) containing electrical apparatus which must be protected from water damage. Integral with the wall 14 is a potting cup 16 located on the inside of the wall, through which the conductor 10 and its insulator 12 extends. After installation of the conductor 10 and its insulator 12, the potting cup 16 is filled with a potting compound 18 to preclude entry of water through the wall 14. Although this arrangement works satisfactorily in many applications, it does not provide a watertight seal if the electrical package is subjected to total immersion in water. Leakage can still result, by capillary action, if there are small cracks or imperfections in the insulation 12, or by leakage between the insulation and the potting compound 18, or sometimes by leakage through the potting compound 18 itself.

In accordance with the present invention, a wall 14' preferably of thermoplastic material is fitted with a feed-through connector insert 20 in such a manner as to provide a near perfect watertight seal. An opening 22 in the wall 14' is dimensioned so that the connector insert 20 is not assembled by means of a conventional press fit. Instead, the interference level between the opening 22 and the connector insert 20 is increased to such a degree that the compressive yield strength of the thermoplastic material is exceeded during fitting of the connector insert into the opening. The over-stressed thermoplastic material "cold flows" into surface imperfections of the insert 20. As the material flows in this manner, the stress level drops below the yield point of the material, but still maintains a high pressure on the now perfect interface between the thermoplastic material and the connector insert. Although thermoplastic materials are preferred for the wall 14', it will be appreciated that some thermosetting material can be cold flowed and will serve equally as well.

Figure 2:
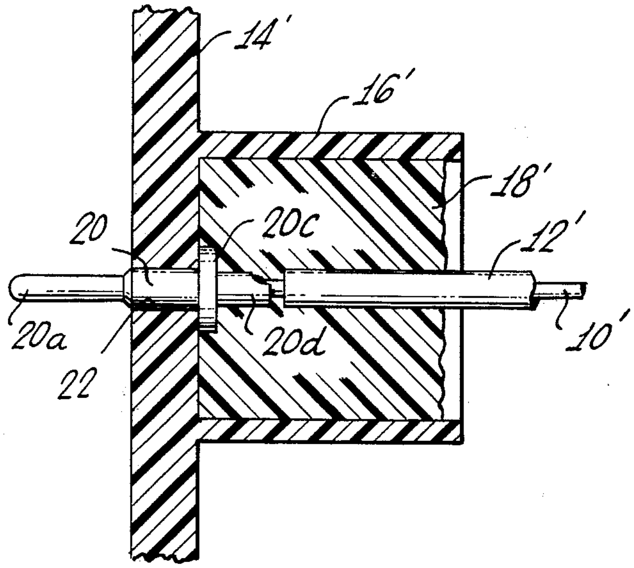
FIG. 2 is an elevational view, partly in section, of the connector of the present invention.

As shown in FIG. 2, the connector insert 20 comprises an elongated prong **20*a* of slightly smaller diameter than that portion which is in contact with the wall 14'. The prong 20*a* extends outwardly from the wall 14' when the connector is installed and is employed in a conventional manner for the attachment of electrical leads. On the inside face of the wall 14' is a flange 20*c* which abuts the inside face and prevents further movement of the connector insert when it is fitted into the opening 22. Extending inwardly from the flange 20*c* is an inner portion 20*d* of the insert, to which the conductor 10 may be electrically connected, as by crimping, soldering or other means. A portion of the conductor 10 inside the wall 14' is covered with an insulation material 12' and, together with the inner portion 20*d* of the connector insert, is encapsulated in a potting material 18' retained in a potting cup 16'** which is formed integrally with the wall.

It will be appreciated from the foregoing description that the present invention represents an important advance in the field of waterproof feed-through electrical connectors. The integrity of a watertight package can be maintained, using this connector, at a cost substantially below that of other connectors of equivalent performance. It will also be appreciated that, although a specific embodiment of the invention has been described in detail for purposes of illustration, various changes and modifications may be made without departing from the spirit and scope of the invention. Accordingly, the invention is not to be limited except as by the appended claims.

I claim:

1. A waterproof electrical connector assembly comprising:
- a portion of a wall of a housing through which electrical connection is to be made, said wall portion being of a plastic material;
- an opening in said wall portion through which electrical connection is to be made; and
- a conductive insert dimensioned to be fitted in said opening by sufficient force to exceed the compressive yield strength of the plastic material and to induce cold flow of the material into surface imperfections of said insert, thereby forming a substantially perfect watertight seal.

2. A waterproof electrical connector assembly as set forth in claim 1, wherein said wall portion is of thermoplastic material.

3. A waterproof electrical connector assembly as set forth in claim 1, and further including:
- a conductor electrically connected to said insert inside said wall portion;
- a potting cup formed integrally with and on the inside of said wall portion, to surround said conductive insert; and
- a quantity of waterproof potting material filling said potting cup and thereby providing a secondary seal to exclude water from the housing.

4. A waterproof electrical connector assembly as set forth in claim 1, wherein said conductive insert includes:
- a central portion which is force-fitted into said opening;
- an outer portion to provide electrical connection from outside the housing;
- a flange located inwardly of said central portion; and
- an inner portion to provide electrical connection inside the housing.

5. A method of making a waterproof electrical connection through the housing wall of an electrical package, said method comprising the steps of:
- forming an opening in a portion of the wall being made of a plastic material;
- force-fitting a conductive insert in the hole in such a manner as to exceed the compressive yield point of the plastic material; and
- cold-flowing the plastic material into any surface imperfections of the insert, to form a substantially perfect watertight seal therewith.

6. A method as set forth in claim 5, and further including the steps of:
- connecting an electrical conductor to the inside of the insert; and
- encapsulating that portion of the insert inside the wall, together with a portion of the conductor, with a waterproof potting material to provide a secondary seal.

* * * * *